(12) United States Patent
Cho et al.

(10) Patent No.: US 11,127,911 B2
(45) Date of Patent: Sep. 21, 2021

(54) DISPLAY PANEL AND METHOD OF MANUFACTURING THEREOF

(71) Applicants: HKC CORPORATION LIMITED, Shenzhen (CN); CHONGQING HKC OPTOELECTRONICS TECHNOLOGY CO., LTD., Chongqing (CN)

(72) Inventors: En-Tsung Cho, Chongqing (CN); Hejing Zhang, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 70 days.

(21) Appl. No.: 16/349,593

(22) PCT Filed: Nov. 8, 2018

(86) PCT No.: PCT/CN2018/114556
§ 371 (c)(1),
(2) Date: May 13, 2019

(87) PCT Pub. No.: WO2020/093309
PCT Pub. Date: May 14, 2020

(65) Prior Publication Data
US 2020/0335714 A1    Oct. 22, 2020

(30) Foreign Application Priority Data
Nov. 5, 2018 (CN) .......................... 201811306319.1

(51) Int. Cl.
*H01L 51/50* (2006.01)
*H01L 27/32* (2006.01)
*H01L 51/56* (2006.01)

(52) U.S. Cl.
CPC .......... *H01L 51/502* (2013.01); *H01L 27/322* (2013.01); *H01L 27/3244* (2013.01);
(Continued)

(58) Field of Classification Search
CPC ........................... H01L 51/502; H01L 27/322
See application file for complete search history.

(56) References Cited

U.S. PATENT DOCUMENTS

2018/0261790 A1* 9/2018 Ichikawa ............ H01L 51/5044

FOREIGN PATENT DOCUMENTS

| CN | 1725438 A | 1/2006 |
|---|---|---|
| CN | 105552244 A | 5/2016 |

(Continued)

OTHER PUBLICATIONS

International Search Report issued in corresponding International application No. PCT/CN2018/114556, dated Dec. 8, 2019.
(Continued)

*Primary Examiner* — Omar F Mojaddedi
*Assistant Examiner* — Mohammad A Rahman

(57) ABSTRACT

The present application discloses a display panel and method of manufacturing thereof. The display panel of the present application includes a substrate, an active switch, a color photoresist layer, a first electrode layer, a light emitting diode, a second electrode layer, an encapsulation layer and a driver circuit. The light emitting diode includes a red light emitting layer, a green light emitting layer and a blue light emitting layer which includes a silicon-germanium quantum dot material.

16 Claims, 8 Drawing Sheets

(52) U.S. Cl.
CPC .......... *H01L 51/5044* (2013.01); *H01L 51/56* (2013.01); *H01L 2227/323* (2013.01)

(56) References Cited

FOREIGN PATENT DOCUMENTS

| | | |
|---|---|---|
| CN | 105932028 A | 9/2016 |
| CN | 108376695 A | 8/2018 |

OTHER PUBLICATIONS

Written opinion of the International Search Authority in corresponding International application No. PCT/CN2018/114556, dated Dec. 8, 2019.
First Office Action from China patent office in a counterpart Chinese patent Application 201811306319.1, dated Oct. 24, 2019 (6 pages).
Second Office Action from China patent office in a counterpart Chinese patent Application 201811306319.1, dated Aug. 6, 2020 (5 pages).

* cited by examiner

DISPLAY PANEL AND METHOD OF MANUFACTURING THEREOF

The present application claims priority to Chinese patent application No. CN201811306319.1, filed with the Chinese Patent Office on Nov. 5, 2018, and entitled "DISPLAY PANEL AND METHOD OF MANUFACTURING THEREOF", which is incorporated herein by reference in its entirety.

TECHNICAL FIELD

The present application relates to the field of display technique, particularly to a display panel and method of manufacturing thereof.

BACKGROUND

The statement here merely provides background information relative to the present application, but not necessarily constitutes the prior art.

Displays known by the inventor are generally controlled by active switches. The displays are widely used for having a variety of advantages such as thin, power saving and radiation-free and are mainly included of liquid crystal displays, Organic Light-Emitting Diode (OLED) displays, Quantum Dot Light Emitting Diode (QLED) displays, plasma displays, etc. In terms of apparent structures, both flat type and curved type of displays are included.

With the liquid crystal displays, a liquid crystal panel and a backlight module are included. The principle of operation for the liquid crystal displays is to dispose liquid crystal molecules between two parallel glass substrates and apply a driving voltage to the two glass substrates so as to control a rotation direction of the liquid crystal molecules, thereby refracting lights from a backlight module for producing a screen.

With the OLED displays, an organic light emitting diode is configured to emit lights for displaying. The OLED displays have advantages such as self-luminescence, wide angle of view, almost infinitely high contrast, lower power consumption and high-speed response. In comparison with organic fluorescence luminophores, light emission based on quantum dot has advantages such as high color purity, long lifetime and easy dispersion and may be manufactured by a printing process. Thus, QLED is commonly considered as a strong contender for the next generation of display technique. Current OLEDs are low in composite efficiency and short in lifetime.

SUMMARY

The present application is to provide a display panel so as to improve the performance of a transistor.

The object of the present application is achieved by the following technical solutions.

According to one aspect of the present application, the present application discloses a display panel, including:
 a substrate;
 an active switch formed on the substrate;
 a color photoresist layer formed on the active switch;
 a first electrode layer formed on the color photoresist layer;
 a light emitting diode formed on the first electrode layer;
 a second electrode layer formed on the light emitting diode;
 an encapsulation layer formed on the second electrode layer;
 a driver circuit electrically connected with the first and second electrode layers;
 the light emitting diode includes a red light emitting layer, a green light emitting layer and a blue light emitting layer, each of which includes a silicon-germanium quantum dot material:
 a proportion of silicon in the red light emitting layer ranges from 1%-35% and that of germanium ranges from 65%-90%; the proportion of silicon in the green light emitting layer ranges from 45%-65% and that of germanium ranges from 35%-50%; the proportion of silicon in the blue light emitting layer ranges from 65%-95% and that of germanium ranges from 5%-35%.

According to another aspect of the present application, the present application also discloses a method of manufacturing a display panel, including:
 forming an active switch on a substrate;
 forming a color photoresist layer on the active switch;
 forming a first electrode layer on the color photoresist layer;
 forming a light emitting diode on the first electrode layer;
 forming a second electrode layer on the light emitting diode;
 forming an encapsulation layer on the second electrode layer;
 disposing a driver circuit in electrical connection with the first and second electrode layers;
 the light emitting diode includes a red light emitting layer, a green light emitting layer and a blue light emitting layer, each of which includes a silicon-germanium quantum dot material.

According to another aspect of the present application, the present application also discloses a display device including a display panel, the display panel including:
 a substrate;
 an active switch formed on the substrate;
 a color photoresist layer formed on the active switch;
 a first electrode layer formed on the color photoresist layer;
 a light emitting diode formed on the first electrode layer;
 a second electrode layer formed on the light emitting diode;
 an encapsulation layer formed on the second electrode layer;
 a driver circuit electrically connected with the first and second electrode layers;
 the light emitting diode includes a red light emitting layer, a green light emitting layer and a blue light emitting layer, each of which includes a silicon-germanium quantum dot material;
 a proportion of silicon in the red light emitting layer ranges from 10%-35% and that of germanium ranges from 65%-90%; the proportion of silicon in the green light emitting layer ranges from 45%-65% and that of germanium ranges from 35%-50%; the proportion of silicon in the blue light emitting layer ranges from 65%-95% and that of germanium ranges from 5%-35%. Optionally, the step of forming the light emitting diode on the first electrode layer includes a method of manufacturing the blue light emitting layer:
 forming a plastic cluster;
 forming rods with the plastic clusters;
 arranging the rods in a hexagon form so as to form a hexagonal matrix;

forming an intermediate template set with the hexagonal matrices according to a self-assembling mechanism of organic molecular template;

roasting the intermediate template set to remove the template so as to form a silica frame;

filling the silica frame with the silicon-germanium quantum dot material.

In a technique for self-assembling molecular template via silica frames of the present application, mesoporous silica has a specific pore structure, which is hollow, low in density and large in specific surface area. Thus, the mesoporous silica has unique penetrability, molecule sieving ability, optical performance and adsorption and can improve the property of the blue light emitting layer. Furthermore, due to high electron mobility, the germanium material can improve the light emission efficiency of three-series QLED. Therefore, the electrical conductivity of the backlight source of the three-series QLED is effectively improved, thereby improving the composite performance of the three-series QLED and extending the lifetime thereof.

BRIEF DESCRIPTION OF DRAWINGS

The drawings are included to provide understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts. In the accompanying drawings.

DETAILED DESCRIPTION

Figure 1:
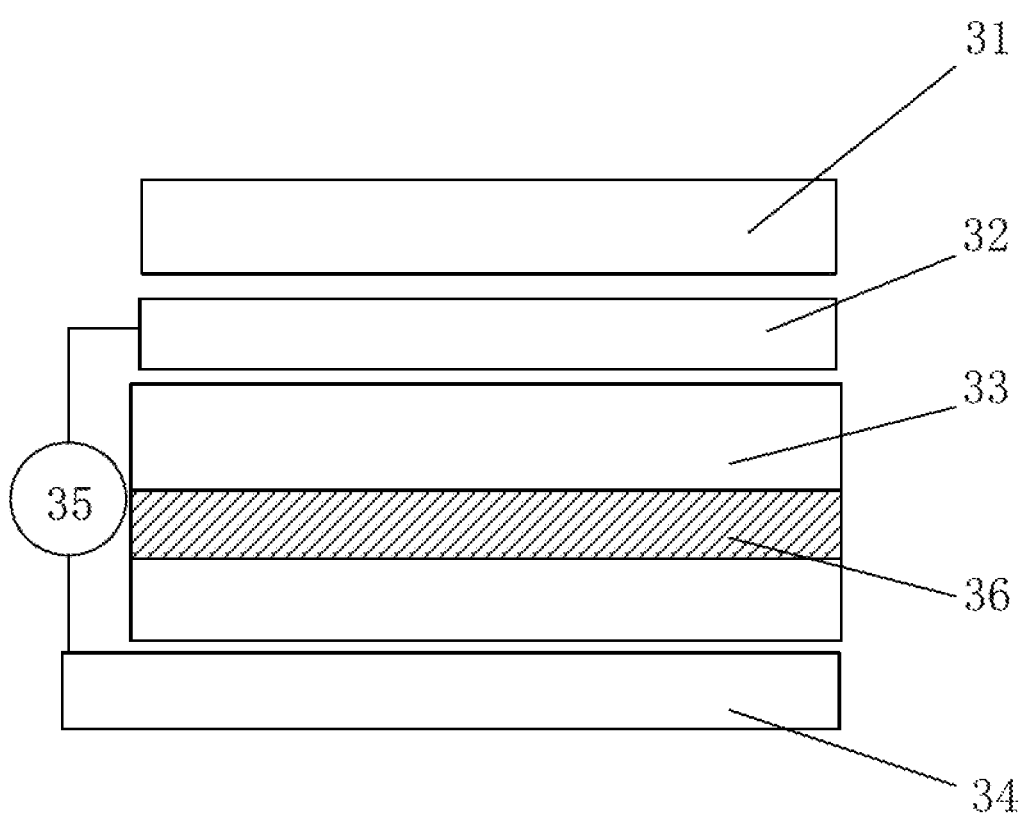
FIG. 1 is a structural schematic diagram of a display panel according to an embodiment of the present application.

The specific structural and functional details disclosed in the embodiments of the present application are merely representative, and are for the purpose of describing exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal". "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose, and cannot be understood as indicating or implying a relative importance, or implicitly indicating the number of the indicated technical features. Hence, the features defined by "first" and "second" can explicitly or implicitly include one or more features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or electrically connected; or directly connected or indirectly connected through an intermediate medium, or in an internal communication between two elements. The specific meanings about the foregoing terms in the present application may be understood by those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

Detailed description is optionally made for the present implementation in connected with FIGS. 1-10 and optional embodiments.

With reference to FIGS. 1 and 8-10, the present implementation discloses a display panel, including:

an encapsulation layer 31;

a first electrode layer 32 disposed on the encapsulation layer 31;

a light emitting diode 33 disposed on the first electrode layer 32;

a second electrode layer 34 disposed on the light emitting diode 33; and a driver circuit 35 electrically connected with the first electrode layer 32 and the second electrode layer 34.

The light emitting diode 33 includes a red light emitting layer 40, a green light emitting layer 44 and a blue light emitting layer 36, each of which includes a silicon-germanium quantum dot material 14.

A proportion of silicon in the red light emitting layer ranges from 10%-35% and that of germanium ranges from 65%-90%. The proportion of silicon in the green light emitting layer ranges from 45%-65% and that of germanium ranges from 35%-50%. The proportion of silicon in the blue light emitting layer ranges from 65%-95% and that of germanium ranges from 5%-35%.

In an embodiment, the blue light emitting layer 36 includes a silica frame 10 which is made from a mesoporous material 16 (i.e., a mesoporous silica material). A silicon-germanium quantum dot material 14 is formed within the silica frame 10 which includes several cylindrical holes 12. The holes 12 run through the silica frame 10 and are filled with the silicon-germanium quantum dot material 14. Silicon and germanium are also embedded into silica hole walls 11. The silica frame 10 includes several cylindrical holes 12. The holes 12 run through the silica frame 10 and are filled with the silicon-germanium quantum dot material 14. It is convenient to use a self-assembling molecular template solution oxide to implement the structure with holes 12. The holes 12 may be either cylindrical or polygonal. The structures with holes 12 in different shapes can be accomplished according to different processes and product demands. Therefore, the structures with holes 12 in various shapes fall in the conceptual scope of the present implementation.

In an embodiment, the holes 12 are disposed in a hexagonal pattern. The arrangement in the hexagonal pattern may form a honeycomb like structure which is good in stability.

In an embodiment, the holes 12 have a diameter D1 in the range of 2-7 nanometers, and the walls thereof have a thickness D2 in the range of 1-2 nanometers. The thickness of the walls of the holes 12 range from 1-2 nanometers. Oversize and undersize are both not appropriate for the holes and the walls thereof. The performance of the blue light emitting layer 36 may be ensured when the diameter of the holes 12 ranges from 2-7 nanometers and the thickness of the walls thereof ranges from 1-2 nanometers.

In an embodiment, the molecular template 13 includes hole walls made from silica material. Nano crystals 15 of indium gallium zinc oxide (IGZO) material containing chemical elements silicon and germanium are formed on the hole walls. The molecular template 13 also has a hollow structure, so that the nano crystals 15 of IGZO material may be uniformly mixed with the mesoporous silica, thereby improving electrical conductivity.

A quantum dot is a zero dimensional system of low-dimensional systems. The typical structure is the dimension thereof is limited within a region of 100 nm, which is shorter than a mean free path of an electron (an average distance travelled by a moving electron between two successive collisions). The quantum dot consists of one or more semiconductors. Different light emitting color may be obtained by controlling the size of the quantum dot.

When a light beam reaches the semiconductor material, electrons in the valence band jump out and into the conduction band after the semiconductor material absorbs photons. The electrons in the conduction band can also jump back into the valence band to emit photons or fall into electron traps of the semiconductor material.

The principle for charge injection of the quantum dot can be introduced using following three steps.

Firstly, when a positive outward bias is applied, a hole and an electron overcome an energy barrier at an interface and enter a valence band level of the hole transport layer and a conduction band level of the electron transport layer respectively via anode and cathode injections.

Secondly, due to the level difference of external electric fields, the hole and electron cause charge accumulation at the interface.

Thirdly, an exciton is formed after the electron and the hole are recombined in the quantum dot. Since a sub-excitation state is not very stable in a general environment and energy is released in the forms of light and heat so as to return to a stable ground state, electroluminescence is a phenomenon of current driving.

In the self-assembling molecular template technique of silica frames, mesoporous silica has a specific pore structure, which is hollow, low in density and large in specific surface area. Thus, the mesoporous silica has unique penetrability, molecule sieving ability, optical performance and adsorption and can improve the property of the blue light emitting layer. Furthermore, due to high electron mobility, the germanium material can improve the light emission efficiency of three-series QLED. Therefore, the electrical conductivity of the backlight source of the three-series QLED is effectively improved, thereby improving the composite performance of the three-series QLED and extending the lifetime thereof. The molecular template self-assembling technique of the silicon-germanium nano IGZO (GE, SiGe) is utilized in the present implementation as a precursor IGZO source of an object such that the silicon-hydroxyl functional group at the surface of the molecular template of the subject can be converted into nano dots necessary for nano IGZO, germanium and silicon. The electrical conductivity of the blue light emitting layer is thus substantially increased, thereby improving the performance of the QLED.

Figure 2:
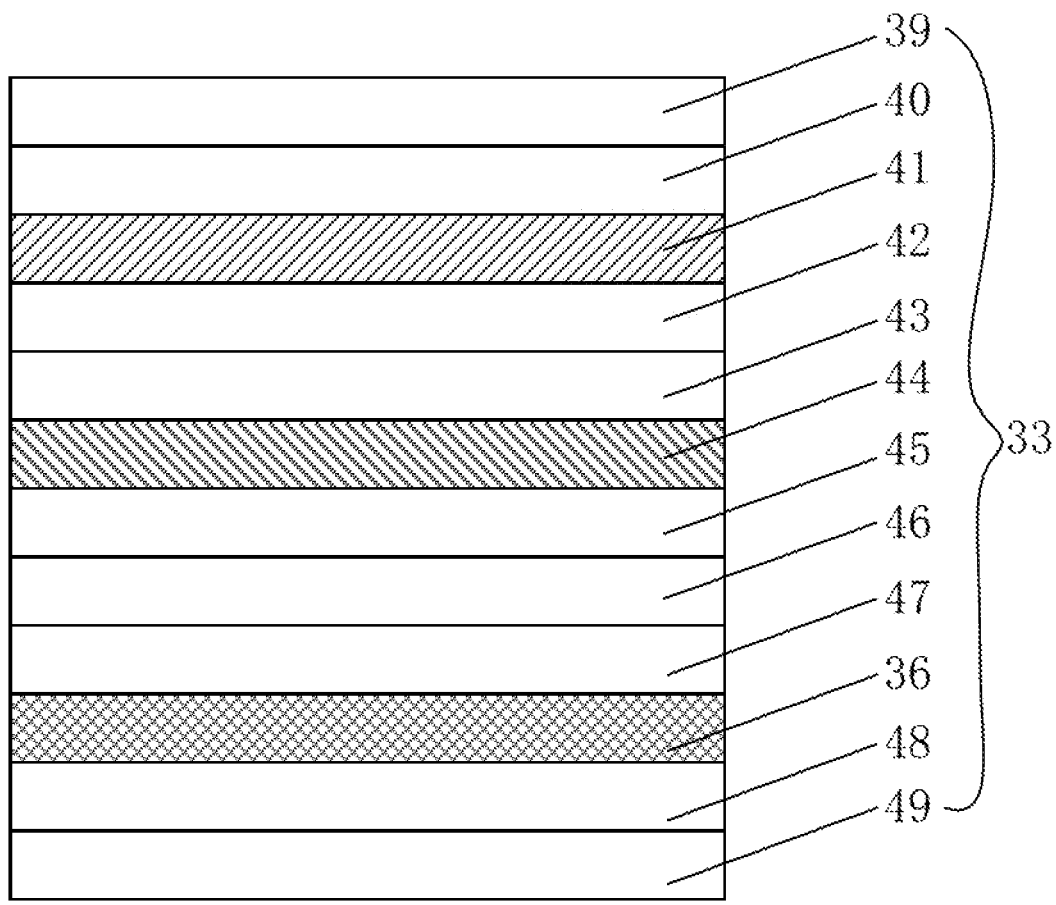
FIG. 2 is a structural schematic diagram of a light emitting diode according to an embodiment of the present application.

The embodiment shown in FIG. 2 discloses a specific light emitting diode 33, including:

the electron injection layer 37 electrically connected with the first electrode layer 32;

the first electron transport layer 39 formed on the electron injection layer 37, the red light emitting layer 40 being formed on the first electron transport layer 39:

the first hole transport layer 41 formed on the red light emitting layer 40;

the first intermediate connector 42 formed on the first hole transport layer 41;

the second electron transport layer 43 formed on the first intermediate connector 42, the green light emitting layer 44 being formed on the second electron transport layer 43;

the second hole transport layer 45 formed on the green light emitting layer 44;

the second intermediate connector 46 formed on the second hole transport layer 45;

the third electron transport layer 47 formed on the second intermediate connector 46;

the blue light emitting layer 36 formed on the third electron transport layer 47;

the third hole transport layer 48 formed on the blue light emitting layer 36; and the hole injection layer 49 formed on the third hole transport layer 48 and electrically connected with the second electrode layer 34.

The specific construction of the blue light emitting layer may be found with reference to the abovementioned implementation and is not repeated here.

Figure 3:
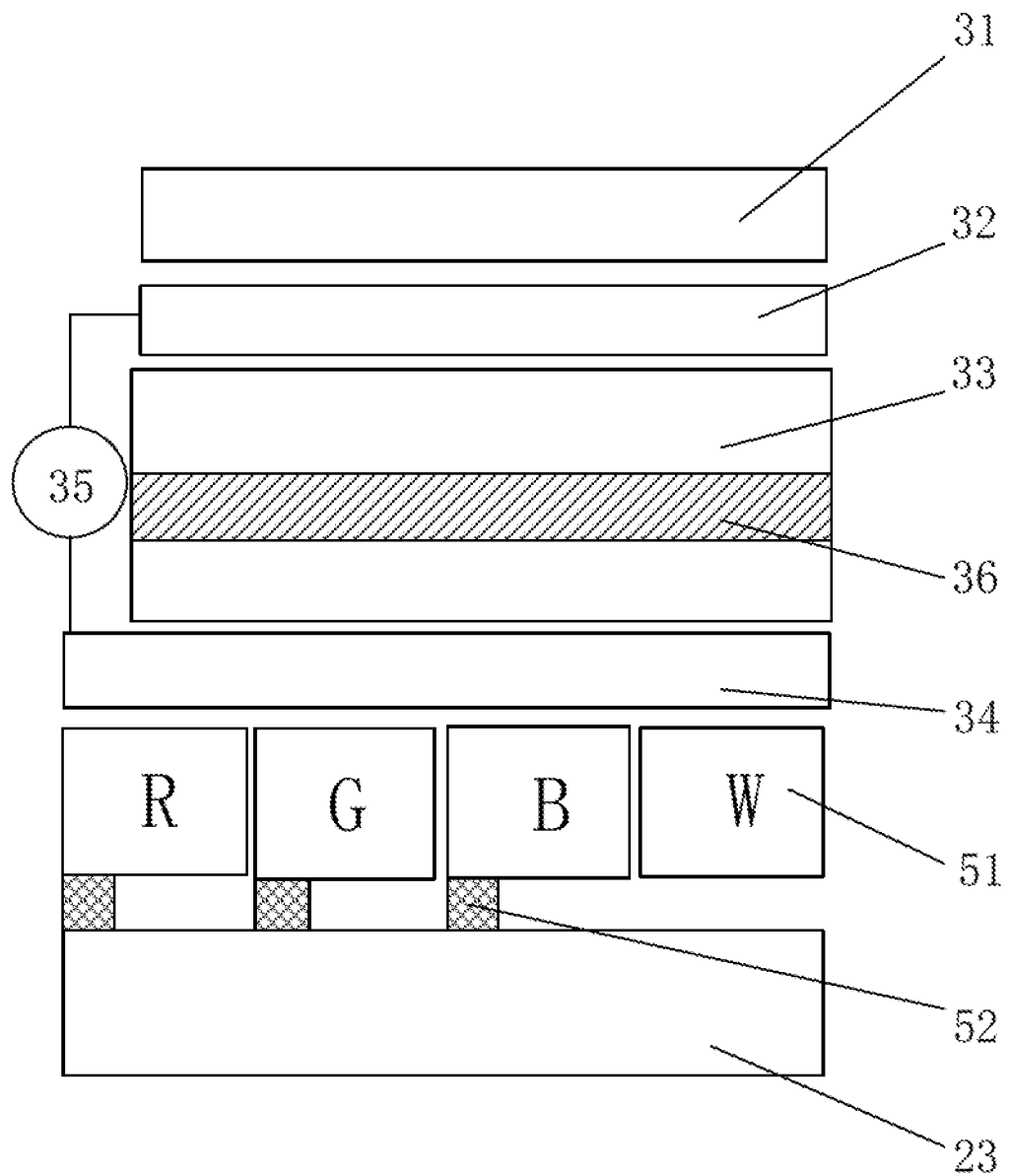
FIG. 3 is a structural schematic diagram of a display device according to an embodiment of the present application.

With reference to FIG. 3, the present implementation discloses a display device including a display panel and the display panel described in the present application. The display panel includes:

a substrate 23;

a plurality of active switches 52 formed on the substrate 23; and a plurality of color photoresist layers 51 formed on the active switches 52.

The second electrode layer 34 is overlaid on the plurality of color photoresist layers 51 and is made from a transparent conductive material, e.g., indium tin oxides (ITOs). The specific constructions of the display panel and the blue light emitting layer 36 may be found with reference to the abovementioned implementation and are not repeated here.

Figure 4:
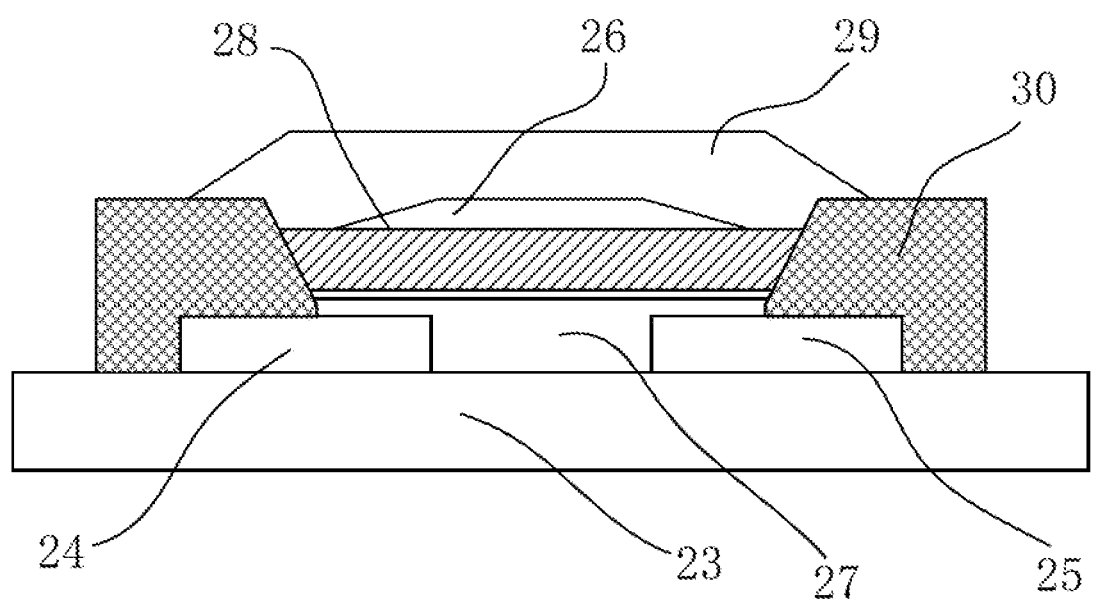
FIG. 4 is a structural schematic diagram of an active switch according to an embodiment of the present application.

The implementation shown in FIG. 4 discloses a specific structure of an active switch 52, which includes:

a source electrode 24 and a drain electrode 25 formed on the substrate 23 of the display panel;

two slope structures 30 formed on the substrate 23 and respectively covering the source electrode 24 and the drain electrode 25, a groove structure being formed between the two slope structures 30;

a semiconductor layer 27 disposed between the two slope structures 30 and connecting the source electrode 24 with the drain electrode 25;

a dielectric layer 28 disposed between the two slope structures 30 and formed on the semiconductor layer 27;

a gate electrode 26 formed on the dielectric layer 28; and a passivation layer 29 formed on the gate electrode 26.

The semiconductor layer 27 includes the silica frame 10 in which the synthetic nano-material containing indium gallium zinc oxide is disposed. The silica frame 10 has a specific pore structure, which is hollow, low in density and large in specific surface area. Thus, the mesoporous silica 10 has unique penetrability, molecule sieving ability, optical performance and adsorption and can improve the property of the semiconductor layer 27. The molecular template self-assembling technique of the silicon-germanium nano IGZO (GE, SiGe) is utilized in the present implementation as a precursor IGZO source of an object such that the silicon-hydroxyl functional group at the surface of the molecular template of the subject can be converted into nano dots necessary for nano IGZO, germanium and silicon. The electrical conductivity of the semiconductor layer 27 is thus substantially increased, thereby improving the performance of the TFT.

Figure 5:
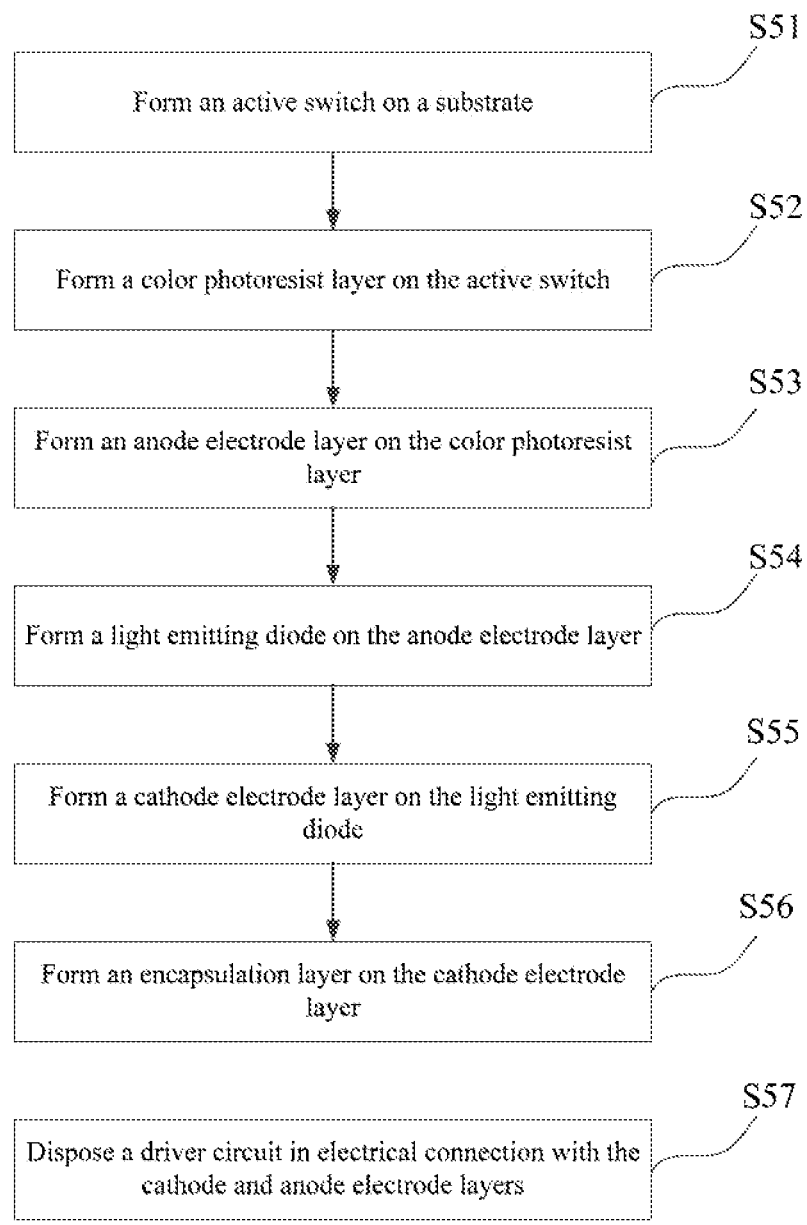
FIG. 5 is a schematic diagram of a method of manufacturing a display panel according to an embodiment of the present application.
Figure 6:
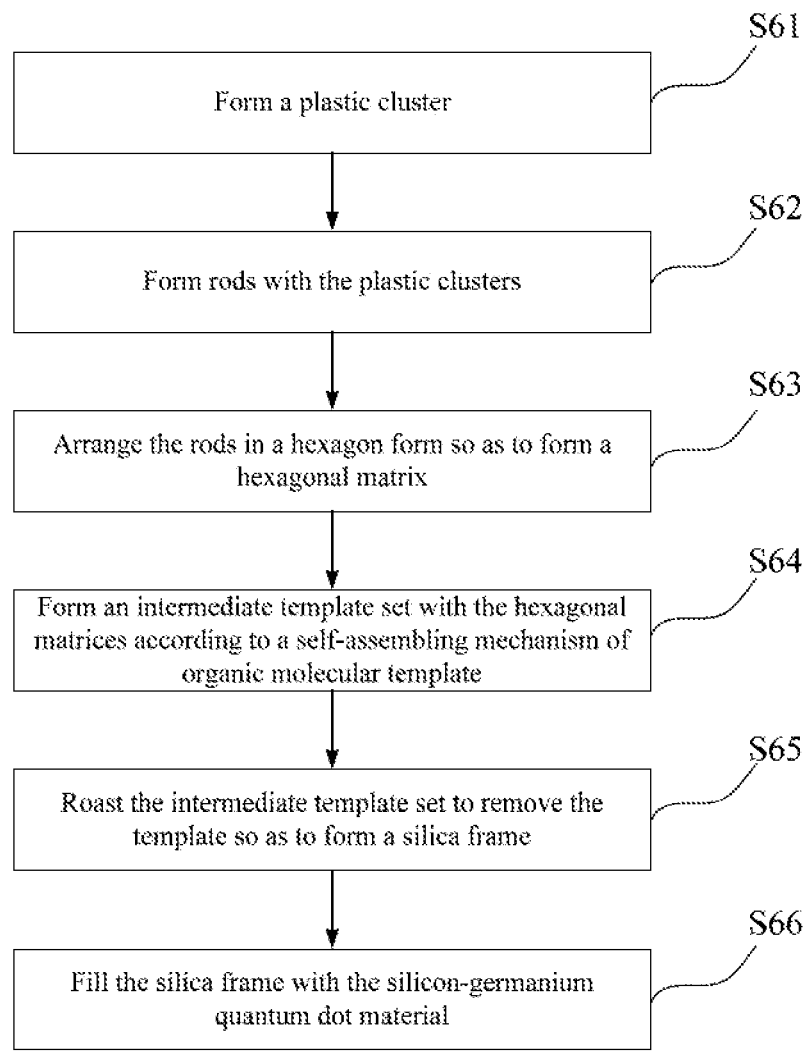
FIG. 6 is a schematic diagram of a method of manufacturing a light emitting diode according to an embodiment of the present application.
Figure 7:
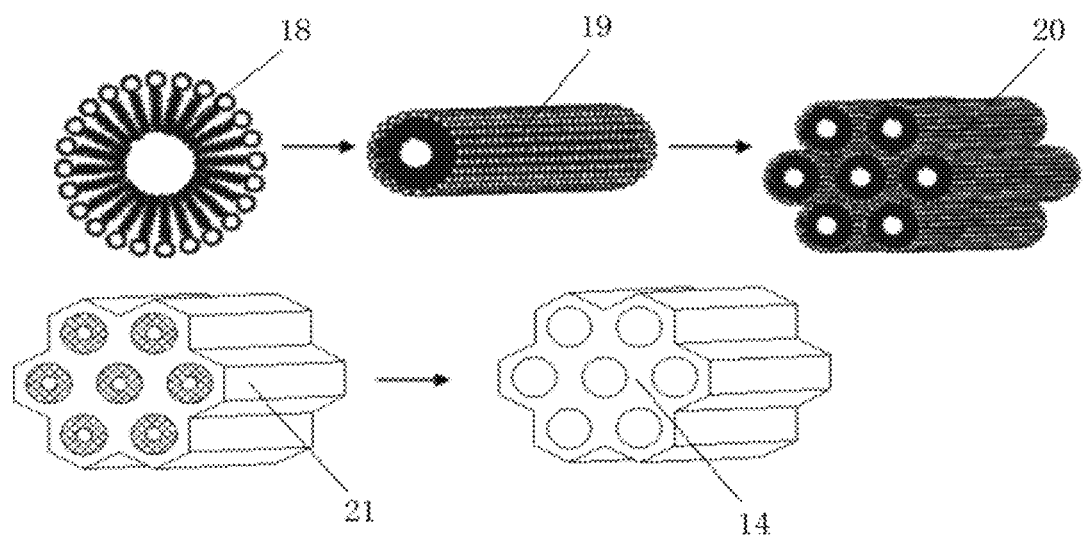
FIG. 7 is a schematic flow diagram of a method of forming a silica frame through self-assembling a molecular template according t 3 an embodiment of the resent application.
Figure 8:
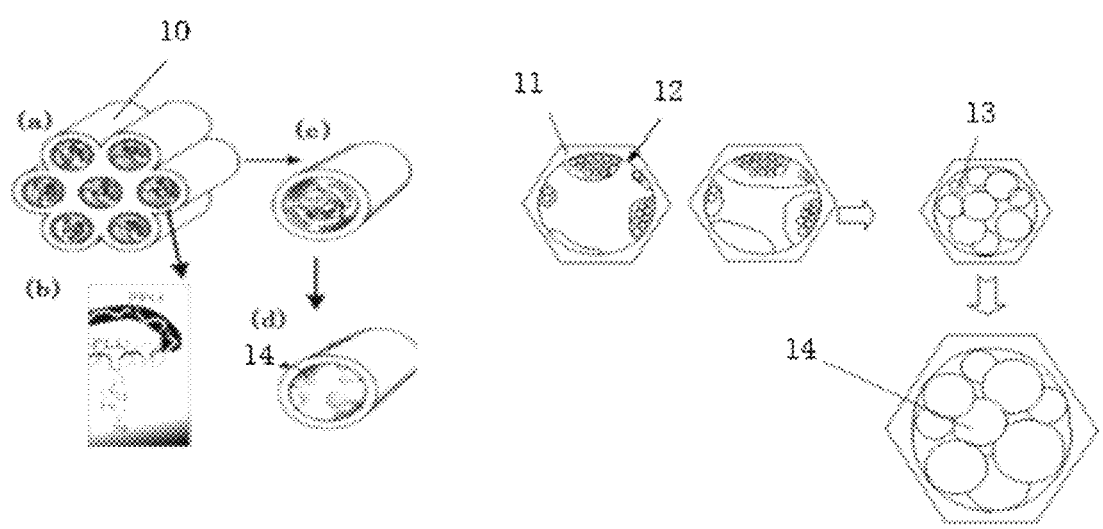
FIG. 8 is a schematic diagram of a technique for self-assembling a mesoporous silica frame according to an embodiment of the present application.
Figure 9:
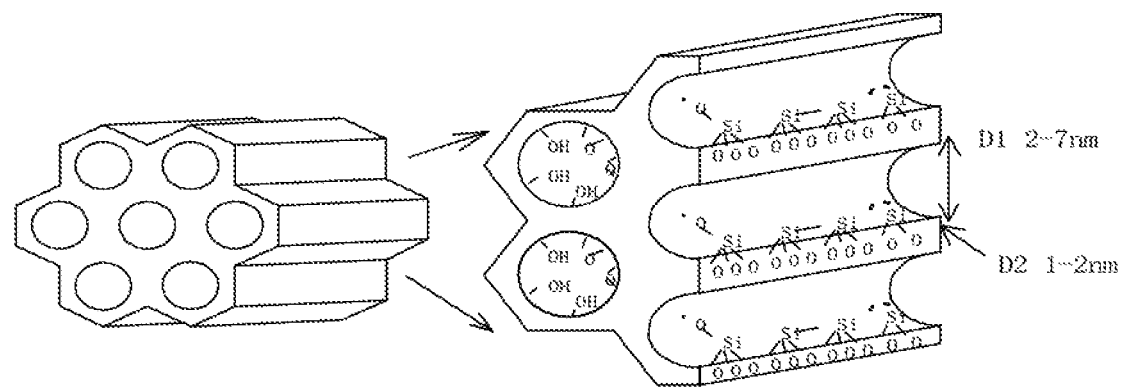
FIG. 9 is a schematic diagram of a method of preparing a nano-porous silica medium according to an embodiment of the present application.
Figure 10:
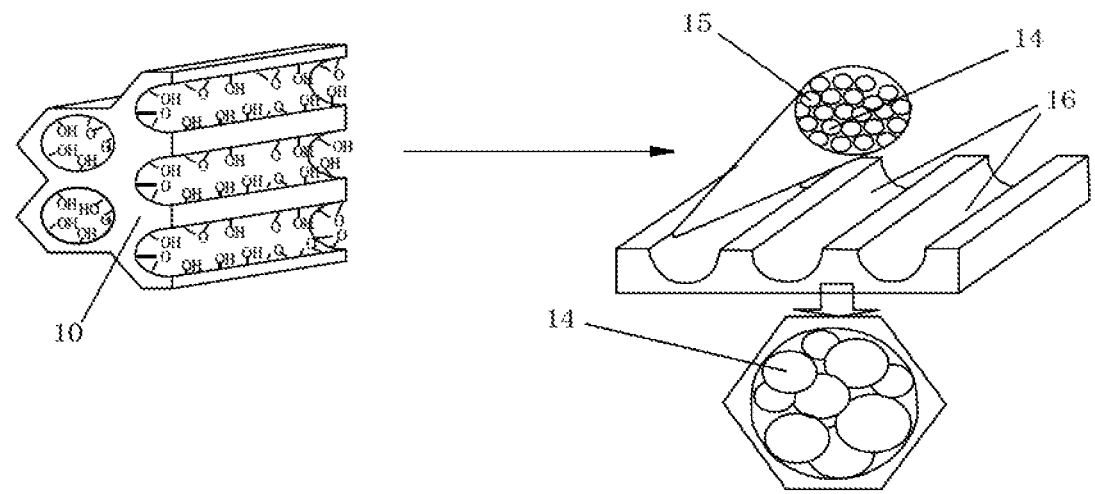
FIG. 10 is a schematic flow diagram of a method of a method of forming a silica frame through self-assembling a molecular template according to an embodiment of the present application.

With reference to FIG. 5, the present implementation discloses a method of manufacturing the display panel, including:

S51: Form an active switch on a substrate.

S52: Form a color photoresist layer on the active switch.

S53: Form a first electrode layer on the color photoresist layer.

S54: Form a light emitting diode on the first electrode layer.

S55: Form a second electrode layer on the light emitting diode.

S56: Form an encapsulation layer on the second electrode layer.

S57: Dispose a driver circuit in electrical connection with the first and second electrode layers.

The light emitting diode includes a red light emitting layer, a green light emitting layer and a blue light emitting layer, each of which includes a silicon-germanium quantum dot material.

In the self-assembling molecular template technique of silica frames of the present application, mesoporous silica has a specific pore structure, which is hollow, low in density and large in specific surface area. Thus, the mesoporous silica has unique penetrability, molecule sieving ability, optical performance and adsorption and can improve the property of the blue light emitting layer. Furthermore, due to high electron mobility, the germanium material can improve the light emission efficiency of the QLED. Therefore, the electrical conductivity of the backlight source of the QLED is effectively improved, thereby improving the composite performance of the QLED and extending the lifetime thereof. The specific construction of the blue light emitting layer may be found with reference to the abovementioned implementation and is not repeated here.

With reference to FIGS. 6-10, the present implementation discloses a method of manufacturing the blue light emitting layer of the light emitting diode, including:

S61: Form a plastic cluster 18.

S62: Form rods 19 with the plastic clusters 18.

S63: Arrange the rods 19 in a hexagon form so as to form a hexagonal matrix 20.

S64: Form an intermediate template set with the hexagonal matrices 20 according to a self-assembling mechanism of organic molecular template.

S65: Roast the intermediate template set to remove the template so as to form a silica frame 10.

S66: Fill the silica frame 10 with the silicon-germanium quantum dot material 14.

The hexagonal matrices consisting of rods 19 made of plastic clusters are used as templates which are both shaping agent and stabilizing agent per se. The desired adjustment and control of the material structure can be achieved through changing the shape and size of the templates. Also, the experimental devices are simple and easy in operation. Further, the rods 19 can be reused, which reduces wastes and has benefits of reducing cost and environmental pollution. The specific constructions of the display panel and the blue light emitting layer may be found with reference to the abovementioned implementation and are not repeated here.

The abovementioned embodiments, the active switches may be thin-film transistors, and the display panel may include a liquid crystal panel, a plasma panel, an OLED panel, a QLED panel and the like. Moreover, the display panel may be either a flat type panel or a curved type panel.

The foregoing are optional detailed description of the present application in connection with specific optional embodiments and are not considered as limiting of the embodiments of the present application. Various simple deductions and substitutions may be made by persons of ordinary skills in the art of the present application without departing from the spirit of the present application and should be considered as within the scope of protection of the present application.

What is claimed is:

1. A display panel, comprising:
   a substrate;
   an active switch formed on the substrate;
   a color photoresist layer formed on the active switch;
   a first electrode layer formed on the color photoresist layer;
   a light emitting diode formed on the first electrode layer;
   a second electrode layer formed on the light emitting diode;
   an encapsulation layer formed on the second electrode layer; and
   a driver circuit electrically connected with the first and second electrode layers;
   wherein the light emitting diode comprises a red light emitting layer, a green light emitting layer and a blue light emitting layer, each of which comprises a silicon-germanium quantum dot material;

a proportion of silicon in the red light emitting layer ranges from 10%-35% and that of germanium ranges from 65%-90%; the proportion of silicon in the green light emitting layer ranges from 45%-65% and that of germanium ranges from 35%-50%; the proportion of silicon in the blue light emitting layer ranges from 65%-95% and that of germanium ranges from 5%-35%.

2. The display panel according to claim 1, wherein the light emitting diode comprises:
an electron injection layer electrically connected with the first electrode layer;
a first electron transport layer formed: on the electron injection layer, the red light emitting layer being formed on the first electron transport layer;
a first hole transport layer formed on the red light emitting layer;
a first intermediate connector formed on the first hole transport layer;
a second electron transport layer formed on the first intermediate connector, the green light emitting layer being formed on the second electron transport layer;
a second hole transport layer formed on the green light emitting layer;
a second intermediate connector formed on the second hole transport layer;
a third electron transport layer formed on the second intermediate connector;
the blue light emitting layer formed on the third electron transport layer;
a third hole transport layer formed on the blue light emitting layer; and
a hole injection layer formed on the third hole transport layer and electrically connected with the second electrode layer.

3. The display panel according to claim 1, wherein the blue light emitting layer comprises a silica frame which has a silicon-germanium quantum dot material formed therein and comprises several cylindrical holes; the holes run through the silica frame and are filled with the silicon-germanium quantum dot material.

4. The display panel according to claim 3, wherein the holes are disposed in a hexagonal pattern.

5. The display panel according to claim 3, wherein the holes have a diameter in a range of 2-7 nanometers, and the walls thereof have a thickness in a range of 1-2 nanometers.

6. The display panel according to claim 2, wherein the red light emitting layer and the green light emitting layer each comprises a silica frame which has the silicon-germanium quantum dot material formed therein and comprises several cylindrical holes; the holes run through the silica frames and are filled with the silicon-germanium quantum dot material.

7. The display panel according to claim 1, wherein the light emitting diode comprises:
the electron injection layer electrically connected with the first electrode layer; the first electron transport layer formed on the electron injection layer, the red light emitting layer being formed on the first electron transport layer; the first hole transport layer formed on the red light emitting layer; the first intermediate connector formed on the first hole transport layer; the second electron transport layer formed on the first intermediate connector, the green light emitting layer being formed on the second electron transport layer; the second hole transport layer formed on the green light emitting layer; the second intermediate connector formed on the second hole transport layer; the third electron transport layer formed on the second intermediate connector; the blue light emitting layer formed on the third electron transport layer; the third hole transport layer formed on the blue light emitting layer; and the hole injection layer formed on the third hole transport layer and electrically connected with the second electrode layer;
wherein the blue light emitting layer comprises the silica frame which has the silicon-germanium quantum dot material formed therein and comprises several cylindrical holes; the holes run through the silica frame and are filled with the silicon-germanium quantum dot material; the holes are disposed in a hexagonal pattern; the holes have the diameter in the range of 2-7 nanometers, and the walls thereof have the thickness in the range of 1-2 nanometers.

8. The display panel according to claim 1, wherein the active switch comprises:
a source electrode and a drain electrode formed on the substrate of the display panel;
two slope structures formed on the substrate and respectively covering the source electrode and the drain electrode, a groove structure being formed between the two slope structures;
a semiconductor layer disposed between the two slope structures and connecting the source electrode with the drain electrode;
a dielectric layer disposed between the two slope structures and formed on the semiconductor layer;
a gate electrode formed on the dielectric layer; and
a passivation layer formed on the gate electrode;
wherein the semiconductor layer comprises a silica frame in which a synthetic nano-material containing indium gallium zinc oxide is disposed.

9. A display device comprising a display panel, the display panel comprising:
a substrate;
an active switch formed on the substrate;
a color photoresist layer formed on the active switch;
a first electrode layer formed on the color photoresist layer;
a light emitting diode formed on the first electrode layer;
a second electrode layer formed on the light emitting diode;
an encapsulation layer formed on the second electrode layer; and
a driver circuit electrically connected with the first and second electrode layers;
wherein the light emitting diode comprises a red light emitting layer, a green light emitting layer and a blue light emitting layer, each of which comprises a silicon-germanium quantum dot material;
a proportion of silicon in the red light emitting layer ranges from 10%-35% and that of germanium ranges from 65%-90%; the proportion of silicon in the green light emitting layer ranges from 45%-65% and that of germanium ranges from 35%-50%; the proportion of silicon in the blue light emitting layer ranges from 65%-95% and that of germanium ranges from 5%-35%.

10. The display device according to claim 9, wherein the light emitting diode comprises:
an electron injection layer electrically connected with the first electrode layer;
a first electron transport layer formed on the electron injection layer, the red light emitting layer being formed on the first electron transport layer;

a first hole transport layer formed on the red light emitting layer;

a first intermediate connector formed on the first hole transport layer;

a second electron transport layer formed on the first intermediate connector, the green light emitting layer being formed on the second electron transport layer;

a second hole transport layer formed on the green light emitting layer;

a second intermediate connector formed on the second hole transport layer;

a third electron transport layer formed on the second intermediate connector;

the blue light emitting layer formed on the third electron transport layer;

a third hole transport layer formed on the blue light emitting layer; and a hole injection layer formed on the third hole transport layer and electrically connected with the second electrode layer.

11. The display device according to claim 9, wherein the blue light emitting layer comprises a silica frame which has a silicon-germanium quantum dot material formed therein and comprises several cylindrical holes; the holes run through the silica frame and are filled with the silicon-germanium quantum dot material.

12. The display device according to claim 11, wherein the holes are disposed in a hexagonal pattern.

13. The display device according to claim 11, wherein the holes have a diameter in a range of 2-7 nanometers, and the walls thereof have a thickness in a range of 1-2 nanometers.

14. The display device according to claim 10, wherein the red light emitting layer and the green light emitting layer each comprises a silica frame which has the silicon-germanium quantum dot material formed therein and comprises several cylindrical holes; the holes run through the silica frames and are filled with the silicon-germanium quantum dot material.

15. The display device according to claim 9, wherein the light emitting diode comprises:

the electron injection layer electrically connected with the first electrode layer; the first electron transport layer formed on the electron injection layer, the red light emitting layer being formed on the first electron transport layer; the first hole transport layer formed on the red light emitting layer; the first intermediate connector formed on the first hole transport layer; the second electron transport layer formed on the first intermediate connector, the green light emitting layer being formed on the second electron transport layer; the second hole transport layer formed on the green light emitting layer; the second intermediate connector formed on the second hole transport layer; the third electron transport layer formed on the second intermediate connector; the blue light emitting layer formed on the third electron transport layer; the third hole transport layer formed on the blue light emitting layer; and the hole injection layer formed on the third hole transport layer and electrically connected with the second electrode layer;

wherein the blue light emitting layer comprises the silica frame which has the silicon-germanium quantum dot material formed therein and comprises several cylindrical holes; the holes run through the silica frame and are filled with the silicon-germanium quantum dot material; the holes are disposed in a hexagonal pattern; the holes have the diameter in the range of 2-7 nanometers, and the walls thereof have the thickness in the range of 1-2 nanometers.

16. The display device according to claim 9, wherein the active switch comprises:

a source electrode and a drain electrode formed on the substrate of the display panel;

two slope structures formed on the substrate and respectively covering the source electrode and the drain electrode, a groove structure being formed between the two slope structures;

a semiconductor layer disposed between the two slope structures and connecting the source electrode with the drain electrode;

a dielectric layer disposed between the two slope structures and formed on the semiconductor layer;

a gate electrode formed on the dielectric layer; and a passivation layer formed on the gate electrode;

wherein the semiconductor layer comprises a silica frame in which a synthetic nano-material containing indium gallium zinc oxide is disposed.

* * * * *